United States Patent
Darling et al.

(10) Patent No.: US 10,220,614 B1
(45) Date of Patent: Mar. 5, 2019

(54) METHODS AND SYSTEMS FOR EJECTING DROPS FROM INKJETS FOLLOWING A PERIOD OF LATENCY

(71) Applicant: XEROX CORPORATION, Norwalk, CT (US)

(72) Inventors: Douglas Dean Darling, Portland, OR (US); Reid W. Gunnell, Wilsonville, OR (US); Brian Edward Williams, Woodburn, OR (US)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 15/679,578

(22) Filed: Aug. 17, 2017

(51) Int. Cl.
  *B41J 2/045* (2006.01)
  *B41J 2/21* (2006.01)
  *G01R 19/25* (2006.01)
  *B41J 2/04* (2006.01)

(52) U.S. Cl.
  CPC ....... *B41J 2/04581* (2013.01); *B41J 2/04573* (2013.01); *B41J 2/04575* (2013.01); *B41J 2/04588* (2013.01); *B41J 2/2135* (2013.01); *G01R 19/2506* (2013.01); *B41J 2002/043* (2013.01)

(58) Field of Classification Search
  None
  See application file for complete search history.

(56) References Cited

U.S. PATENT DOCUMENTS

| | | | |
|---|---|---|---|
| 9,016,816 B2 | 4/2015 | Terayama et al. | |
| 2015/0097884 A1* | 4/2015 | Taff | B41J 2/04551 347/10 |
| 2016/0347058 A1* | 12/2016 | Suzuki | B41J 2/04588 |

OTHER PUBLICATIONS

IP.com search.*
Wikipedia Article "Amplitude", Retrieved on Jul. 3, 2018, see Definitions: Pulse Amplitude.*

* cited by examiner

*Primary Examiner* — Lisa Solomon
(74) *Attorney, Agent, or Firm* — Miller Nash Graham & Dunn LLP

(57) ABSTRACT

An inkjet printhead including an inkjet configured to eject drops of ink in response to receiving an electrical signal, a memory configured to store image data, and a processor operatively coupled to the inkjet and the memory. The processor receives the image data and determines a period of latency of the inkjet printhead. When the period of latency is within a predetermined timeframe, the processor increases a voltage of the electrical signal to a second voltage for an initial number of drops to eject the drops of ink in a pattern of printed ink drops with reference to at least a portion of the image data and reduce the voltage of the electrical signal after the initial number of drops to eject drops of ink in a pattern of printed ink drops with reference to a remaining portion of the image data, and generates the electrical signal.

20 Claims, 5 Drawing Sheets

METHODS AND SYSTEMS FOR EJECTING DROPS FROM INKJETS FOLLOWING A PERIOD OF LATENCY

TECHNICAL FIELD

This disclosure relates to ejecting ink drops from an inkjet printhead following a period of latency, more particularly to ejecting more robust ink drops from the inkjet printhead after a period of latency.

BACKGROUND

Inkjet printheads for aqueous inks use multiple strategies for mitigating issues caused by ink drying within individual jet orifices. Inkjet printheads typically rely upon a stack of plates referred to as a jet stack, the final plate of which has an array of nozzles. When an inkjet printhead is latent, water or other volatiles evaporate from the ink. Evaporation may happen even during shorter periods of latency, such as less than an hour. Evaporation of water and other volatiles results in an increase in ink viscosity, which causes ink drops to eject with a lower velocity, less drop volume, or, in some cases, not eject at all.

One common technique to counteract the increase in ink viscosity is to purge the inkjet printhead with fresh ink prior to printing. However, this requires time and fresh ink to accomplish, and results in a waste of ink. After a long period of latency, such as more than an hour, purging is often needed, but purging is not a preferred method for shorter periods of latency because of the amount of time and ink required for purging.

Other techniques may use maintenance ink drops, also referred to as sneezing, to keep fresh ink in the inkjet printhead. However, sneezing requires print media to be available to receive the ink drops. Thus, sneezing is useful during a print job, but not between print jobs since there is no print media present.

Finally, non-firing waveforms may be applied to the inkjet. Non-firing waveforms are not strong enough to result in an ink drop and help mix the dry ink near the nozzle with fresher ink in the rest of the inkjet printhead. Mixing the dry ink with fresher ink by using non-firing waveforms helps with the robustness of the first ink drops after a period of latency. However, the effectiveness of the non-firing waveforms is reduced when the ink drops are very small, such as less than 3 pl. When the ink drops are very small, the first ink drops will either still fail to eject or will be noticeably lighter.

What is needed is an improvement in the robustness of the first ink drops ejected after a period of latency, when the latency period is short enough that a purge is not needed, maintenance ink drops are not practical, and/or the drop volume is small (e.g. less than 3 picoliters (pl)).

SUMMARY

One embodiment of the disclosure includes an inkjet printhead, including an inkjet configured to eject drops of ink in response to receiving an electrical signal, the electrical signal including a waveform having sufficient firing voltage to eject the drops of ink from the inkjet; a memory configured to store image data corresponding to a printed imaged formed, at least in part, by the inkjet on an image receiving surface; and a processor operatively coupled to the inkjet and the memory. The processor receives the image data corresponding to the printed image form, determines a period of latency of the inkjet printhead, when the period of latency is within a predetermined timeframe, increases the waveform to a second (elevated) voltage for an initial number of drops to eject the drops of ink in a pattern of printed ink drops with reference to at least a portion of the image data and reduce the waveform to the first (normal firing) voltage after the initial number of drops, to eject drops of ink in a pattern of printed ink drops with reference to a remaining portion of the image data, and generates the electrical signal including the waveform having the second voltage and the first voltage.

Another embodiment of the disclosure includes a method including receiving image data corresponding to a printed image form; determining a period of latency of an inkjet printhead; when the period of latency is within a predetermined timeframe, increasing a firing waveform to a second (elevated) voltage for an initial number of drops to eject the drops of ink in a pattern of printed ink drops with reference to at least a portion of the image data; reducing the firing waveform to a first (normal firing) voltage after the initial number of drops to eject drops of ink in a pattern of printed ink drops with reference to a remaining portion of the image data; generating an electrical signal including the waveform having the first voltage and the second voltage; and receiving the electrical signal at an inkjet to eject drops of ink in response to the electrical signal.

Yet another embodiment of the disclosure includes a computer readable storage medium having instructions stored thereon that, when executed by a processor of an inkjet printhead, cause the inkjet printhead to receive image data corresponding to a printed image form; determine a period of latency of an inkjet printhead; when the period of latency is within a predetermined timeframe, increase a firing waveform to a second (elevated) voltage for an initial number of drops to eject the drops of ink in a pattern of printed ink drops with reference to at least a portion of the image data; reduce the firing waveform to a first (normal firing) voltage after the initial number of drops to eject drops of ink in a pattern of printed ink drops with reference to a remaining portion of the image data; generate an electrical signal including the waveform having the first voltage and the second voltage; and receive the electrical signal at an inkjet to eject drops of ink from a nozzle of the inkjet in response to the electrical signal.

DETAILED DESCRIPTION OF THE EMBODIMENTS

Figure 1:
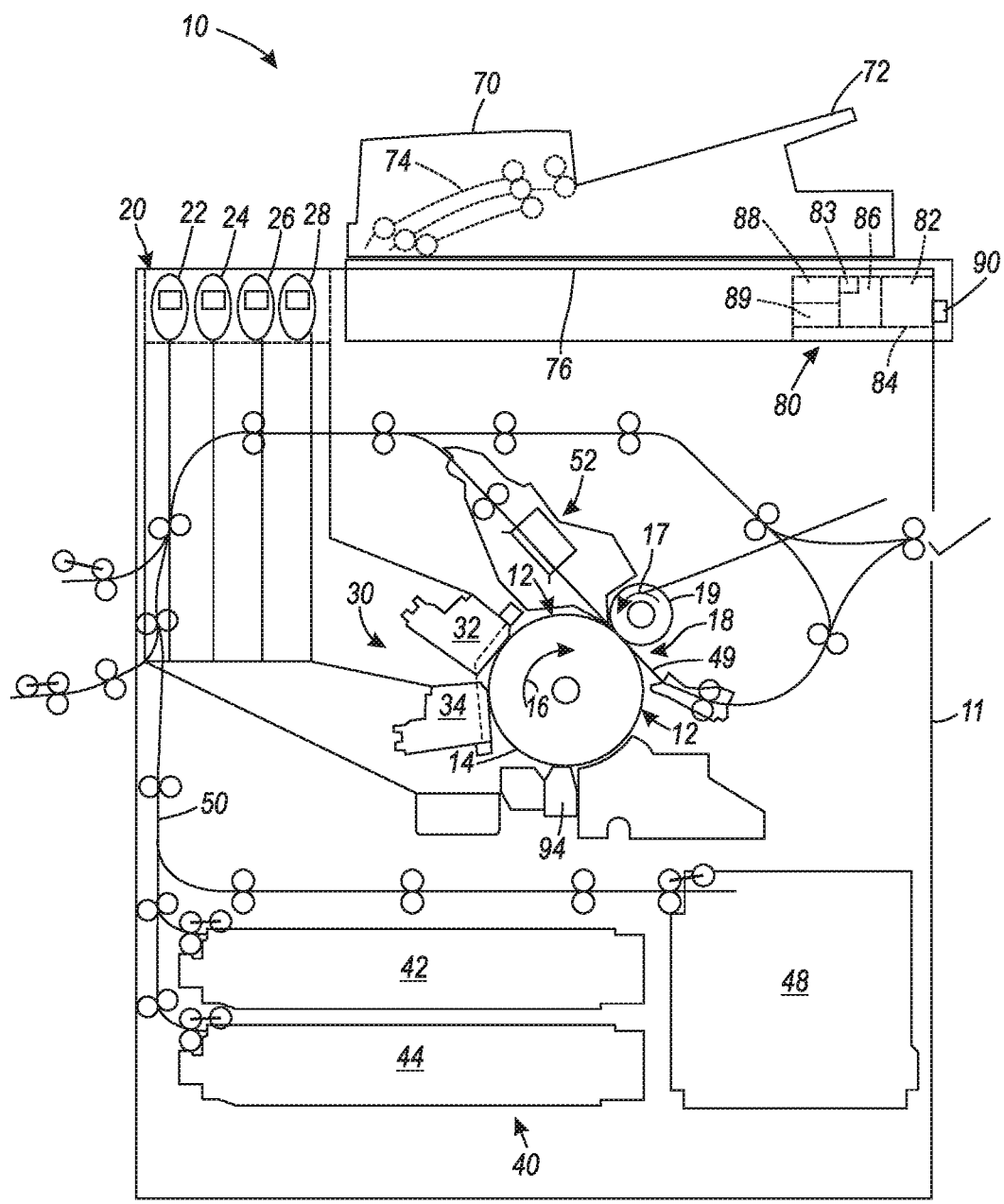
FIG. 1 show an embodiment of an example inkjet printing system.

As used herein, the term "printer" generally refers to an apparatus that applies an ink to print media and can encompass any apparatus, such as a digital copier, book-making machine, facsimile machine, multi-function machine, etc., which performs a print outputting function for any purpose. The printer prints ink images on an image receiving member, and the term "image receiving member" as used herein refers to print media or an intermediate member, such as a drum or belt, which carries an ink image and transfers the ink image to a print medium. "Print media" can be a physical sheet of paper, plastic, or other suitable physical substrate suitable for receiving ink images, whether precut or web fed. As used in this document, "ink" refers to a colorant that is liquid when applied to an image receiving member. For example, ink can be aqueous ink, ink emulsions, melted phase change ink, or gel ink that has been heated to a temperature that enables the ink to be liquid for application or ejection onto an image receiving member and then return to a gelatinous state. A printer can include a variety of other components, such as finishers, paper feeders, and the like, and can be embodied as a copier, printer, or a multifunction machine. An image generally includes information in electronic form, which is to be rendered on print media by a marking engine and can include text, graphics, pictures, and the like.

The term "printhead" as used herein refers to a component in the printer that is configured to eject ink drops onto the image receiving member. A typical printhead includes a plurality of inkjets that are configured to eject ink drops of one or more ink colors onto the image receiving member. The inkjets are arranged in an array of one or more rows and columns. In some embodiments, the inkjets are arranged in staggered diagonal rows across a face of the printhead. Various printer embodiments include one or more printheads that form ink images on the image receiving member. Some printer embodiments include a plurality of printheads arranged in a print zone. An image receiving member, such as a print medium or an intermediate member that holds a latent ink image, moves past the printheads in a process direction through the print zone. The inkjets in the printheads eject ink drops in rows in a cross-process direction, which is perpendicular to the process direction across the image receiving member. An individual inkjet in a printhead ejects ink drops that form a line extending in the process direction as the image receiving surface moves past the printhead in the process direction.

As used herein, the terms "electrical firing signal," "firing signal," and "electrical signal" are used interchangeably to refer to an electrical energy waveform that triggers an actuator in an inkjet to eject an ink drop. Examples of actuators in inkjets include, but are not limited to, piezoelectric, and electrostatic actuators. A piezoelectric actuator includes a piezoelectric transducer that changes shape when the firing signal is applied to the transducer. The transducer proximate to a pressure chamber that holds liquid ink, and the change in shape of the transducer urges some of the ink in the pressure chamber through an outlet nozzle in the form of an ink drop that is ejected from the inkjet. In an electrostatic actuator, the ink includes electrically charged particles. The electrical firing signal generates an electrostatic charge on an actuator with the same polarity as the electrostatic charge in the ink to repel ink from the actuator, to eject an ink drop from the inkjet.

As used herein, the term "peak voltage level" refers to a maximum amplitude level of an electrical firing signal. As described in more detail below, some firing signals include a waveform with both positive and negative peak voltage levels. The positive peak voltage level and negative peak voltage level in a firing signal waveform may have the same amplitude or different amplitudes. In some inkjet embodiments, the peak voltage level of the firing signal affects the mass and velocity of the ink drop that is ejected from the inkjet in response to the firing signal. For example, higher peak voltage levels for the firing signal increase the mass and velocity of the ink drop that is ejected from the inkjet, while lower peak voltage levels decrease the mass and velocity of the ejected ink drop. Since the image receiving surface moves in a process direction relative to the inkjet at a substantially constant rate and typically remains at a fixed distance from the inkjet, changes in the velocity of the ejected ink drops affect the relative locations of where the ink drops land on the image receiving surface in the process direction.

As used herein, the term "waveform component" refers to any parameter in the shape or magnitude of an electrical firing signal waveform that is adjusted to affect the velocity and/or mass of an ink drop that is ejected from an inkjet in response to the generation of the waveform with the adjusted component parameter. The peak voltage level and peak voltage duration are examples of waveform components in electrical firing signals. As described below, an inkjet printer adjusts one or more waveform components including either or both of the peak voltage level and peak voltage duration to adjust the ejection velocities of ink drops on a drop-by-drop basis during an imaging operation. Since different ink drop ejection patterns result in variations of the ink drop velocity due to the characteristics of the inkjet and printhead, the adjustments to the waveform components enable more accurate placement of ink drop patterns on the image receiving surface during the imaging operation.

FIG. 1 depicts an embodiment of a printer 10 that is configured to adjust one or more waveform components of firing signals that are used to operate inkjets on a drop-by-drop basis during a print job. As illustrated, the printer 10 includes a frame 11 to which is mounted directly or indirectly all its operating subsystems and components, as described below. The phase change ink printer 10 includes an image receiving member 12 that is shown in the form of a rotatable imaging drum, but can equally be in the form of a supported endless belt. The imaging drum 12 has an image receiving surface 14, which provides a surface for formation of ink images. An actuator 94, such as a servo or electric motor, engages the image receiving member 12 and is configured to rotate the image receiving member in direction 16. A transfix roller 19 rotatable in the direction 17 loads against the surface 14 of drum 12 to form a transfix nip 18 within which ink images formed on the surface 14 are transfixed onto a heated print medium 49.

The inkjet printer 10 also includes an ink delivery subsystem 20 that has multiple sources of different color inks. Since the inkjet printer 10 is a multicolor printer, the ink delivery subsystem 20 includes four (4) sources 22, 24, 26, 28, representing four (4) different colors CMYK (cyan, magenta, yellow, and black) of inks. Each of the ink sources 22, 24, 26, and 28 includes a reservoir used to supply ink to the printhead assemblies 32 and 34. In the example of FIG. 1, both of the printhead assemblies 32 and 34 receive the CMYK ink from the ink sources 22-28. In another embodiment, the printhead assemblies 32 and 34 are each configured to print a subset of the CMYK ink colors.

The inkjet printer 10 includes a substrate supply and handling subsystem 40. The substrate supply and handling subsystem 40, for example, includes sheet or substrate supply sources 42, 44, 48, of which supply source 48, for example, is a high capacity paper supply or feeder for storing and supplying image receiving substrates in the form of a cut sheet print medium 49. The phase change ink printer 10 as shown also includes an original document feeder 70 that has a document holding tray 72, document sheet feeding and retrieval devices 74, and a document exposure and scanning subsystem 76. A media transport path 50 extracts print media, such as individually cut media sheets, from the substrate supply and handling system 40 and moves the print media in a process direction P. The media transport path 50 passes the print medium 49 through a substrate heater or pre-heater assembly 52, which heats the print medium 49 prior to transfixing an ink image to the print medium 49 in the transfix nip 18.

Media sources 42, 44, 48 provide image receiving substrates that pass through media transport path 50 to arrive at transfix nip 18 formed between the image receiving member 12 and transfix roller 19 in timed registration with the ink image formed on the image receiving surface 14. As the ink image and media travel through the nip, the ink image is transferred from the surface 14 and fixedly fused to the print medium 49 within the transfix nip 18. In a duplexed configuration, the media transport path 50 passes the print medium 49 through the transfix nip 18 a second time for transfixing of a second ink image to a second side of the print medium 49.

Operation and control of the various subsystems, components and functions of the printer 10 are performed with the aid of a controller or electronic subsystem (ESS) 80. The ESS or controller 80, for example, is a self-contained, dedicated mini-computer having a central processor unit (CPU) 82 with a digital memory 84, and a display or user interface (UI) 86. The ESS or controller 80, for example, includes a sensor input and control circuit 88 as well as an ink drop placement and control circuit 89. In one embodiment, the ink drop placement control circuit 89 is implemented as a field programmable gate array (FPGA). In addition, the CPU 82 reads, captures, prepares and manages the image data flow associated with print jobs received from image input sources, such as the scanning system 76, or an online or a work station connection 90. As such, the ESS or controller 80 is the main multi-tasking processor for operating and controlling all of the other printer subsystems and functions.

The controller 80 can be implemented with general or specialized programmable processors that execute programmed instructions, for example, printhead operation. The instructions and data required to perform the programmed functions are stored in the memory 84 that is associated with the processors or controllers. The processors, their memories, and interface circuitry configure the printer 10 to form ink images, and, more particularly, to control the operation of inkjets in the printhead assemblies 32 and 34 to eject ink drops to form printed images. These components are provided on a printed circuit card or provided as a circuit in an application specific integrated circuit (ASIC). Each of the circuits can be implemented with a separate processor or multiple circuits are implemented on the same processor. In alternative configurations, the circuits are implemented with discrete components or circuits provided in very large scale integration (VLSI) circuits. Also, the circuits described herein can be implemented with a combination of processors, FPGAs, ASICs, or discrete components.

In operation, the printer 10 ejects a plurality of ink drops from inkjets in the printhead assemblies 32 and 34 onto the surface 14 of the image receiving member 12. The controller 80 generates electrical firing signals to operate individual inkjets in one or both of the printhead assemblies 32 and 34.

As described in more detail below, the controller 80 identifies image data that corresponding to a predetermined number of pixels that are processed before and after the generation of a firing signal to operate each inkjet in the printhead assemblies 32 and 34. The controller 80 identifies a waveform component adjustment with reference to the patterns of image data using a lookup table that is stored in the memory 84. The controller 80 adjusts the waveform components for the firing signals that are provided to each of the inkjets on a drop-by-drop basis to reduce or eliminate the drop placement errors on the image receiving surface 12 that are caused by the variations in ink drop velocity when the inkjet ejects different patterns of ink drops. While FIG. 1 depicts a controller 80 that controls the operation of the printer 10, in alternative embodiments the functionality of the controller 80 is distributed amongst one or more digital control devices in the printer. For example, in one configuration each printhead in the printhead assemblies 32 and 34 is configured with an individual printhead controller and printhead controller memory modules. The printhead controller in each printhead receives image data from the controller 80 and generates firing signals with varying waveform components based on predetermined waveform component data that are stored in the printhead memory modules. Any suitable configuration of one or more digital logic controllers can be used to perform the operations that are described herein.

The printer 10 is an illustrative embodiment of a printer that adjusts the waveform components of firing signals to improve the robustness of the first ink drops after a period of latency of the printer 10, but the processes described herein are also applicable to alternative inkjet printer configurations. Alternative printer configurations that form ink images using different ink types including aqueous ink, solvent based ink, UV curable ink, phase change ink and the like can be operated using the processes described herein. Additionally, while printer 10 is an indirect printer, printers that eject ink drops directly onto a print medium can be operated using the processes described herein.

Figure 2:
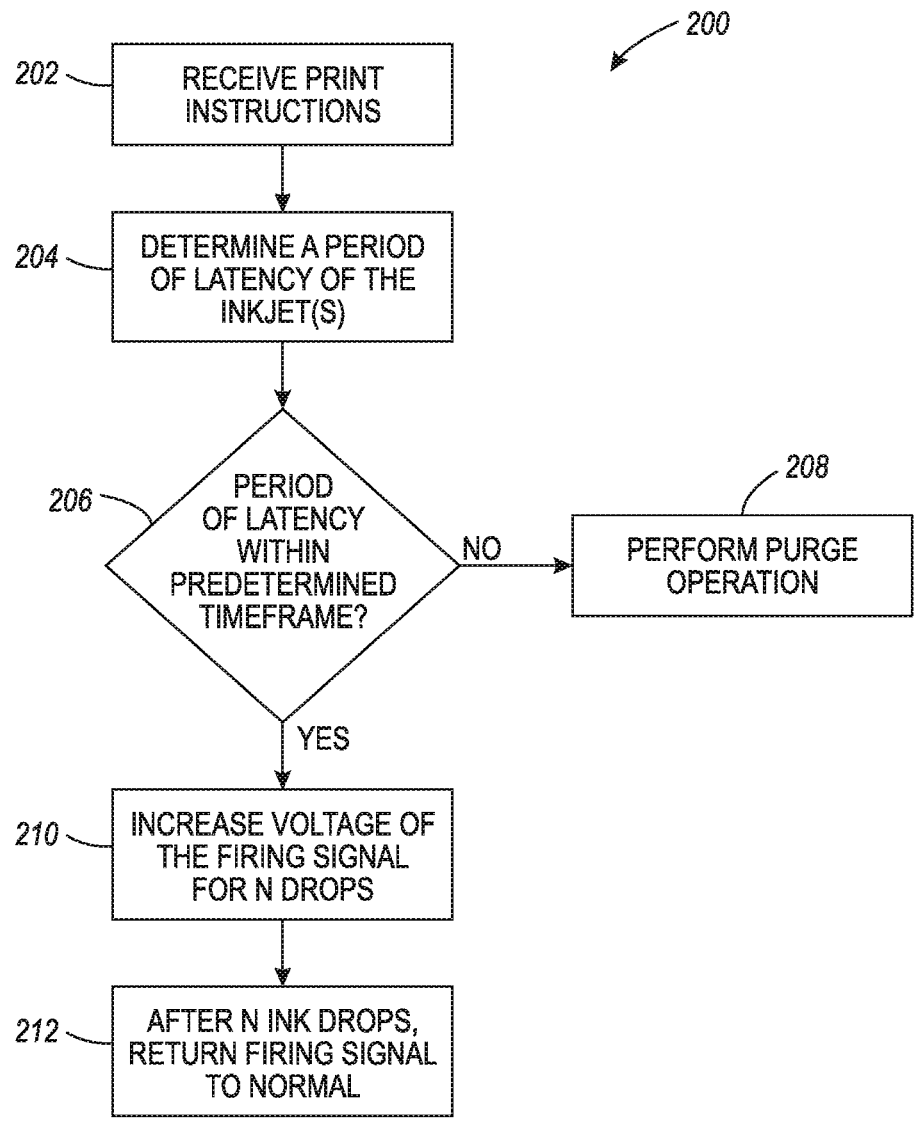
FIG. 2 shows an example flowchart of a process for ejecting ink after a period of latency according to some embodiments of the disclosure.

FIG. 2 illustrates a process 200 for operating an inkjet in a printer, such as printer 10, discussed above, using different waveform components of electrical firing signals to improve the robustness of the first ink drops after a period of latency of the printer. The processor first receives 202 print instructions to print an image on print media. The processor then determines 204 a period of latency of the printhead and whether 206 that period of latency is within a predetermined timeframe. This may be determined directly by a processor in the printhead or it may be determined by controller 80 in the printer 10. The predetermined timeframe may be an amount of time for the jets to be recovered without the need of a purge operation. For example, the predetermined timeframe may be 30 mins or less. In some embodiments, the predetermined timeframe may be an hour or less. That is, the predetermined timeframe may be any time period before a purge operation is required.

If the period of latency is not within the predetermined timeframe, a purge operation 208 is performed to ready the printhead for printing.

If the period of latency is within the predetermined timeframe, then the waveform component of the firing signal is changed so that a peak voltage is increased 210 for the first N ink drops that each inkjet is fired after the period of latency. The number of ink drops, N, may be a predetermined number based on the inkjet design, waveform design, and/or the duration of the latency. For example, in some embodiments, the printhead processor or controller 80 may determine to use a different number of ink drops if the printhead has been latent for 5 minutes versus 30 minutes. The predetermined number of ink drops and how to choose the number of ink drops may be stored in a memory in the printhead or printer 10. For example, the printhead processor or controller 80 may select from a look up table the predetermined number of ink drops based on the period of latency and/or based on the instructions received to print an image on the print media. In other embodiments, a single predetermined number of ink drops may be determined and stored in a memory based on the inkjet design and does not change based on the period of latency.

Further, in some embodiments, a magnitude of the voltage increase may also be a function of the inkjet design, waveform design, and/or the duration of latency. For example, similar to the predetermined number of ink drops, the magnitude of the voltage increase may be less if the period of latency is 5 minutes versus 30 minutes. In some embodiments, the magnitude of the voltage increase may be a function of the number of ink drops that receive the increased voltage of the firing signal.

After the predetermined number N of ink drop has been ejected at the increased voltage, the firing signal returns 212 to normal and the printhead prints in its usual manner.

Figure 3:
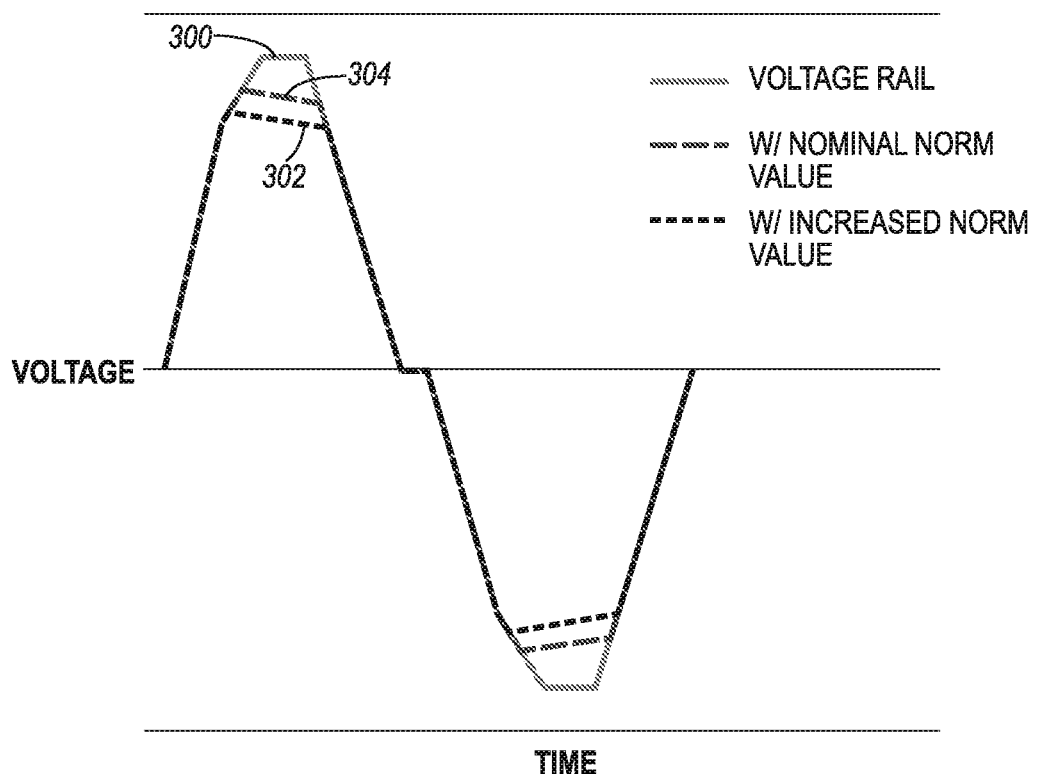
FIG. 3 shows an example of adjusting a normalization value for a waveform component.

In some embodiments, the voltage of the firing signal is increased, as shown in FIG. 3. FIG. 3 illustrates an example firing signal 300. Each jet of the inkjet has a stored normalization value so that each of the jets eject ink at an effective ejection velocity that is nearly identical. The normalization value for each jet is determined based on testing during production of the inkjet. The different peak voltage level and durations for each jet compensate for the variations in ejection velocity due to the physical characteristics of the inkjet and printhead while printing a pattern of ink drops.

Rather than adjusting the overall firing signal 300 for all the individual jets of the inkjet, the normalization value for each desired individual jet may be increased, as shown in FIG. 3. As seen in FIG. 3, the firing signal 300 remains the same, while the magnitude of the normalization value 302 is increased to a voltage 304. This may be beneficial when only some of the jets have been latent during a print job. Rather than increasing the overall firing signal 300, the normalization value may be increased for the initial N number of ink drops for the jets that had been latent, while not increasing the normalization value for the jets that have been active. When a firing signal is received, only the jets that have been latent will see an increase in the voltage of the firing signal, rather than all of the jets.

Figure 4:
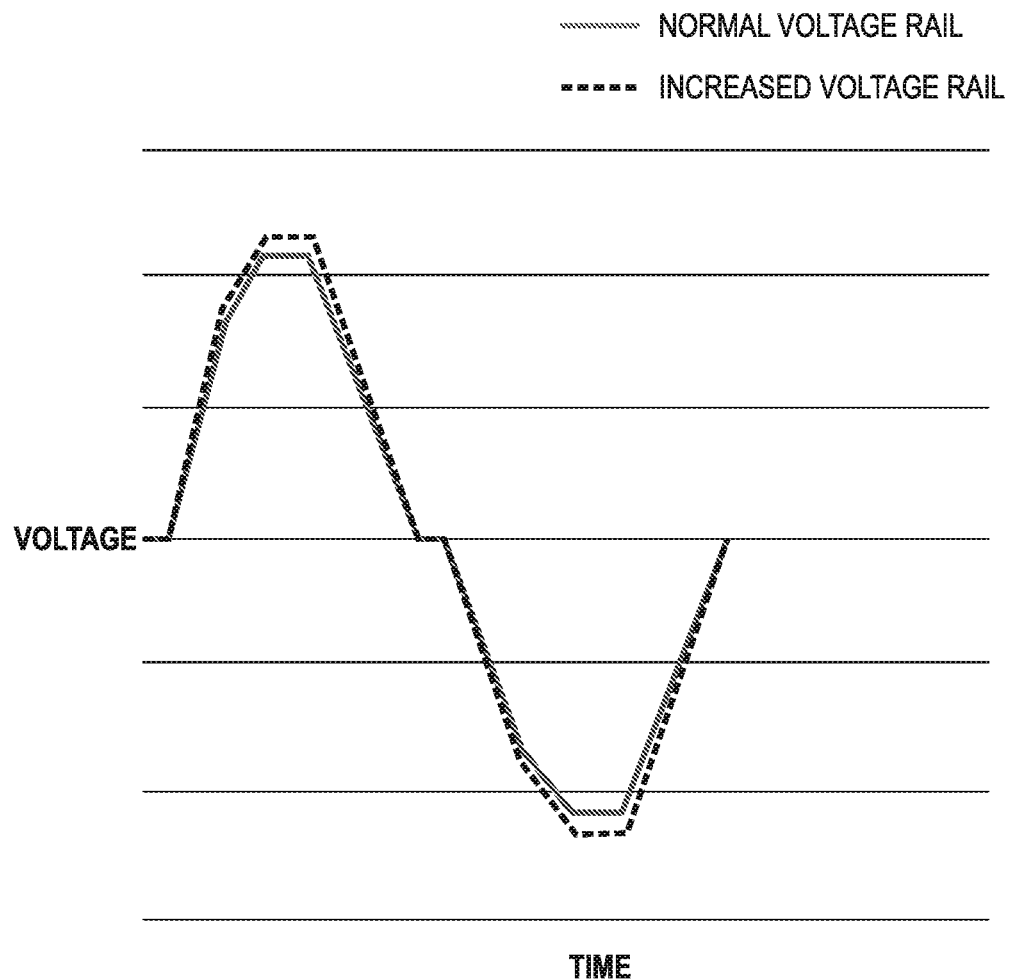
FIG. 4 shows an example of adjusting an overall voltage for a waveform component.

FIG. 4 illustrates another method for increasing the voltage of the ink of the first N drops after a period of latency. In this method, the overall voltage of the firing waveform is increased, but the normalization value for each of the individual jets stay the same. This is simpler than increasing the normalization value for each desired jet, but also requires that all of the jets on a printhead change voltage at the same time. This may be used, for example, when all the jets on a printhead have been latent for the predetermined period of time, such as between print jobs.

Figure 5:
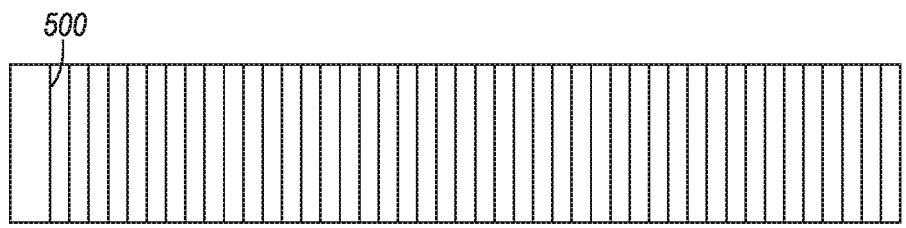
FIG. 5 shows an example of an ideal ink ejection.
Figure 6:
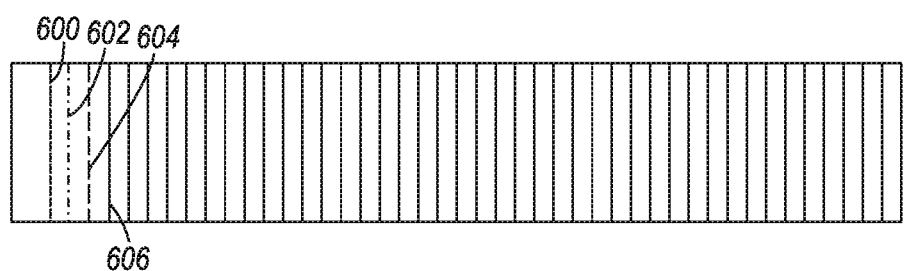
FIG. 6 shows an example of an ink ejection after a period of latency.

FIG. 5 illustrates an ideal ink ejection with fresh ink and no latency for single-pixel lines with 2.8 pl drops. FIG. 5 depicts a plurality of drops following a first drop 500 which includes a full volume of ink. FIG. 6, however, illustrates an example ink ejection after the printhead has been latent for 30 minutes. As can be seen, none of the first drop 600, second drop 602, or third drop 604 are ejected in full from the printhead, despite the printhead receiving a firing pulse. Although drops are shown in the first drop 600, in some situations, no ink may be ejected. The drops do not start fully ejecting until the fourth drop 606. This results in some of the ink not being ejected onto the print media, and the print image being incomplete. FIG. 6, however, is merely an example and, sometimes it will be well past the fourth drop before drops are fully ejecting after a period of latency.

Figure 7:
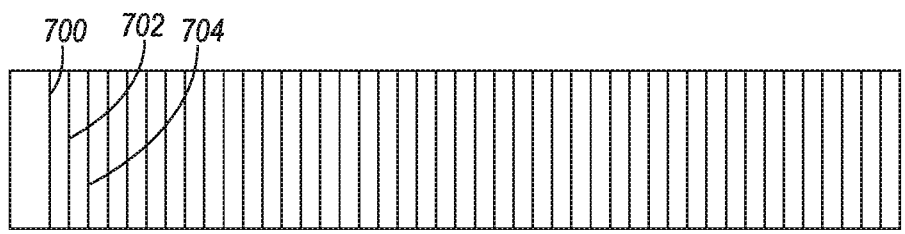
FIG. 7 shows an example of an ink ejection after a period of lately according to some embodiments of the disclosure.

FIG. 7, on the other hand, illustrates an ink ejection after the printhead has been latent for 30 minutes, using the method described in FIGS. 2-4. That is, the voltage of a firing waveform is increased for N number of drops after the period of latency. This may be done by increasing a normalization value for latent jets for a predetermined number of drops after the printhead has been latent, as discussed with respect to FIG. 3, or by increasing the overall firing voltage, as discussed with respect to FIG. 4. In FIG. 7, the first drop 700, second drop 702, and third drop 704 are ejected with a correct volume of ink, so that there is no disruption in the print image, despite the printhead having been latent for a period of time.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. An inkjet printhead, comprising:
   an inkjet configured to eject drops of ink in response to receiving an electrical signal, the electrical signal including a waveform having a firing voltage at a first voltage to eject the drops of ink from the inkjet;
   a memory configured to store image data corresponding to a printed imaged formed, at least in part, by the inkjet on an image receiving surface; and
   a processor operatively coupled to the inkjet and the memory, the processor configured to:
      receive the image data corresponding to the printed image form,
      determine a period of latency of the inkjet printhead,
      when the period of latency is within a predetermined timeframe, increase the waveform to a second voltage for an initial number of drops to eject the drops of ink in a pattern of printed ink drops with reference to at least a portion of the image data and reduce the waveform to the first voltage after the initial number of drops to eject drops of ink in a pattern of printed ink drops with reference to a remaining portion of the image data, and
      generate the electrical signal including the waveform having the second voltage and the first voltage.

2. The inkjet printhead of claim 1, wherein the printhead includes a plurality of inkjets, and the electrical signal is generated for a portion of the plurality of inkjets.

3. The inkjet printhead of claim 2, wherein increasing the waveform to the second voltage includes increasing a normalization value of the waveform for the portion of the plurality of inkjets.

4. The inkjet printhead of claim 1, wherein increasing the waveform to the second voltage includes increasing a normalization value of the waveform.

5. The inkjet printhead of claim 1, wherein each ink drop has a volume of 3 picoliters or less.

6. The inkjet printhead of claim 1, wherein the predetermined timeframe is an hour or less.

7. The inkjet printhead of claim 1, wherein the second voltage is determined based on the initial number of drops.

8. A method, comprising:
   receiving image data corresponding to a printed image form;
   determining a period of latency of an inkjet printhead;
   when the period of latency is within a predetermined timeframe, increasing a firing waveform to a second voltage for an initial number of drops to eject the drops of ink in a pattern of printed ink drops with reference to at least a portion of the image data;
   reducing the firing waveform to a first voltage after the initial number of drops to eject drops of ink in a pattern of printed ink drops with reference to a remaining portion of the image data;
   generating an electrical signal including the waveform having the first voltage and the second voltage; and
   receiving the electrical signal at an inkjet to eject drops of ink in response to the electrical signal.

9. The method of claim 8, wherein the inkjet printhead includes a plurality of inkjets, and an electrical signal is generated for each of the plurality of inkjets.

10. The method of claim 9, wherein increasing the waveform to the second voltage includes increasing a normalization value of the waveform for a portion of the plurality of nozzles.

11. The method of claim 8, wherein increasing the waveform to the second voltage includes increasing a normalization value of the waveform.

12. The method of claim 8, wherein each ink drop has a volume of 3 picoliters or less.

13. The method of claim 8, wherein the predetermined timeframe is an hour or less.

14. The method of claim 8, wherein the second voltage is determined based on the initial number of drops.

15. A computer readable storage medium having instructions stored thereon that, when executed by a processor of an inkjet printhead, cause the inkjet printhead to:
   receive image data corresponding to a printed image form;
   determine a period of latency of an inkjet printhead;
   when the period of latency is within a predetermined timeframe, increase a firing waveform to a second voltage for an initial number of drops to eject the drops of ink in a pattern of printed ink drops with reference to at least a portion of the image data;
   reduce the firing waveform to a first voltage after the initial number of drops to eject drops of ink in a pattern of printed ink drops with reference to a remaining portion of the image data;
   generate an electrical signal including the waveform having the first voltage and the second voltage; and
   receive the electrical signal at an inkjet to eject drops of ink from a nozzle of the inkjet in response to the electrical signal.

16. The computer readable storage medium of claim 15, wherein the inkjet printhead includes a plurality of inkjets, and the instructions further cause the printhead to generate an electrical signal is generated for each of the plurality of inkjets.

17. The computer readable storage medium of claim 16, wherein increasing the waveform to the second voltage includes increasing a normalization value of the waveform for a portion of the plurality of nozzles.

18. The computer readable storage medium of claim 15, wherein increasing the waveform to the second voltage includes increasing a normalization value of the waveform.

19. The computer readable storage medium of claim 15, wherein each ink drop has a volume of 3 picoliters or less.

20. The computer readable storage medium of claim 15, wherein the predetermined timeframe is an hour or less.

* * * * *